(12) United States Patent
Ooi

(10) Patent No.: US 6,975,512 B1
(45) Date of Patent: Dec. 13, 2005

(54) THERMALLY ENHANCED HEAT SINK BGA PACKAGE

(75) Inventor: Wee Kok Ooi, Sungai Dua (MY)

(73) Assignee: Altera Corporation, San Jose, CA (US)

( * ) Notice: Subject to any disclaimer, the term of this patent is extended or adjusted under 35 U.S.C. 154(b) by 102 days.

(21) Appl. No.: 10/286,428

(22) Filed: Oct. 31, 2002

(51) Int. Cl.[7] .............................................. H05K 7/20
(52) U.S. Cl. .................... 361/704; 257/713; 257/784; 257/796; 165/80.2; 165/185; 165/803; 361/708; 361/710; 361/718; 361/722
(58) Field of Search ............................. 165/80.2, 80.3, 165/185; 257/706–707, 712–713, 789–796; 361/704–710, 361/714–723

(56) References Cited

U.S. PATENT DOCUMENTS

| | | | | |
|---|---|---|---|---|
| 5,172,213 | A | * 12/1992 | Zimmerman | ................ 257/796 |
| 5,371,404 | A | * 12/1994 | Juskey et al. | ................ 257/659 |
| 5,909,056 | A | * 6/1999 | Mertol | ....................... 257/704 |
| 6,621,152 | B2 | * 9/2003 | Choi et al. | ................... 257/678 |

* cited by examiner

*Primary Examiner*—Gregory Thompson
(74) *Attorney, Agent, or Firm*—Beyer, Weaver & Thomas

(57) ABSTRACT

Provided are heat sink BGA packages with thermally enhanced mold compounds to further facilitate heat transfer from the die out of the package. Packages in accordance with the present invention incorporate mold compounds with ceramic fillers. The ceramic filled mold compound facilitates the heat transfer between the encapsulated die and the heat sink, thereby enhancing the thermal performance of the package.

29 Claims, 2 Drawing Sheets

THERMALLY ENHANCED HEAT SINK BGA PACKAGE

BACKGROUND OF THE INVENTION

1. Field of the Invention

The present invention relates to methods and assemblies connecting semiconductor die to substrates. More particularly, the present invention relates thermal enhancements to heat sink BGA semiconductor packages.

2. Description of the Related Art

Semiconductor wafer fabrication involves a series of processes used to create semiconductor devices and integrated circuits (ICs) in and on a semiconductor wafer surface. Once the integrated circuits on the wafer are completed the wafer is sliced into sections known as die. The die are then typically packaged by mounting on substrates composed of an organic material or laminate to protect them and facilitate their electrical connection to external circuitry.

In BGA (ball grid array) semiconductor packaging, an individual semiconductor die is mounted and electrically connected to a die side of a substrate. The other side of the substrate has an array bonding pads bearing solder balls (a ball grid array (BGA)) by which electrical connection can be made to external circuitry, generally on a printed circuit board (PCB). The die is mounted on the substrate by a epoxy adhesive and electrical pads on the top of the die are then wire bonded to electrical pads on the bonding fingers of the substrate to complete the electrical connection of the die to the substrate.

Heat dissipation is a major factor in integrated circuit reliability. In order to improve heat dissipation from the die in the BGA package, a heat sink is often employed. One design incorporates an exposed drop-in heat sink. A heat sink, generally composed of a conductive metal such as copper is bonded, for example, by soldering or with a thermal adhesive, to the substrate. This drop-in heat sink is configured to at least partially surround the die, without contacting it or the wire bonds between it and the substrate.

The package is then sealed by a mold compound, or encapsulant, in a molding operation. A polymeric mold composition heated above its flow temperature is applied over the die on the substrate and molded to form a housing for the die. The sealed package protects the die from breakage, and hazardous environmental contaminants. The top of the heat sink is exposed at the top of the mold compound to facilitate heat dissipation. Upon further cooling, the mold compound cures and the package is ready for bonding to a PCB.

While such heat sink BGA packages have improved heat dissipation from BGA packages, further enhancements to BGA package heat dissipation would be desirable.

SUMMARY OF THE INVENTION

To achieve the foregoing, the present invention provides heat sink BGA packages with thermally enhanced mold compounds to further facilitate heat transfer from the die out of the package. Packages in accordance with the present invention incorporate mold compounds with ceramic fillers. A suitable mold compound may contain from about 60% to 90% by weight of a suitable ceramic material in an epoxy resin. Any ceramic with greater thermal conductivity than the mold compound with which it is mixed and that does not have chemical or electrical properties that would otherwise detrimentally impact device performance may be used. For example, $Al_2O_3$ and AlN are suitable mold compound fillers in accordance with the present invention. Suitable resins are well known in the art and include biphenyl, ortho cresol novolac (OCN) and dichlorophenol (DCP) epoxy resins, and others. In one preferred embodiment, $Al_2O_3$ 80% by weight with a biphenyl resin is used in a mold compound. The ceramic filled mold compound facilitates the heat transfer between the encapsulated die and the heat sink, thereby enhancing the thermal performance of the package.

In one aspect, the invention relates to a semiconductor ball grid array package. The package includes a ball grid array packaging substrate, a semiconductor die mounted on and electrically connected with the substrate, and a heat sink connected with the substrate and at least partially surrounding the die. A mold compound encapsulates the die and on the substrate and contacts the heat sink. The mold compound is composed of a mixture of an epoxy resin and ceramic filler material that increases the thermal conductivity of the mold compound.

In another aspect, the invention relates to a semiconductor packaging mold compound, including an epoxy resin and a ceramic filler material that increases the thermal conductivity of the mold compound.

In yet another aspect, the invention relates to a method of assembling a semiconductor die with a packaging substrate. The method involves providing a ball grid array packaging substrate, mounting and electrically connecting the die with the substrate, and connecting a heat sink with the substrate and at least partially surrounding the die. A mold compound is applied over the die, the mold compound comprising a mixture of an epoxy resin and ceramic filler material that increases the thermal conductivity of the mold compound. The mold compound is then cured to encapsulate the die on the substrate.

These and other features and advantages of the present invention are described below where reference to the drawings is made.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

When used in combination with "comprising," "a method comprising," "a device comprising" or similar language in this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The present invention provides heat sink ball grid array (BGA) packages with thermally enhanced mold compounds to further facilitate heat transfer from the die out of the package. Packages in accordance with the present invention incorporate mold compounds with ceramic fillers. A suitable mold compound may contain from about 60% to 90% by weight of a suitable ceramic material in an epoxy resin. Any ceramic with greater thermal conductivity than the mold compound resin with which it is mixed and that does not have chemical or electrical properties that would otherwise detrimentally impact device performance may be used. The ceramic filled mold compound facilitates the heat transfer between the encapsulated die and the heat sink, thereby enhancing the thermal performance of the package.

Figure 1:
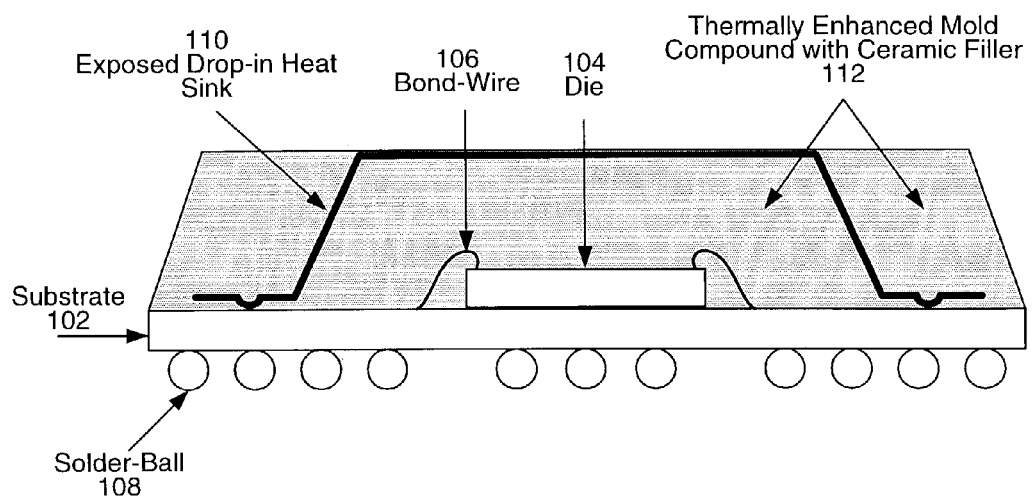
FIG. 1 depicts a cross-sectional view of a thermally enhanced BGA package in accordance with one embodiment of the present invention.

FIG. 1 shows a cross-sectional view of a thermally enhanced heat sink BGA package in accordance with one embodiment of the present invention. The package 100 includes a BGA substrate 102. The substrate may be any such suitable substrate for a BGA package. For example, the substrate may be composed of an organic material or laminate with a CTE of about 15 to 20 ppm, e.g., 17 ppm, such as fiber glass, PTFE (such as Teflon™, available form Gore, Eau Claire, Wis.) BT resin, epoxy laminates or ceramic-plastic composites.

A semiconductor die 104 is mounted on one surface of the substrate 102. The die may be mounted in any suitable way. Generally, the die is mounted to the substrate surface using a thermo-set epoxy material, for example, a silver epoxy. The die 104 is also electrically connected to the substrate 102. The electrical connection is provided by bond wires 106 connecting pads on the die to pads on the surface of the substrate on which the die is mounted (the 'die side'). Conductive paths in the substrate 102, typically provided by embedded metal traces and or lines, electrically connect pads on the die side of the substrate to pads on the opposite side ('board side') of the substrate. An array of a solder balls 108 is provided on the board side pads. The completed package 100 is subsequently mounted on a printed circuit board (PCB) by solder bonds formed by reflowing or alloying these solder balls 108.

The package 100 further includes a drop-in heat sink 110 which at least partially surrounds the die 104, without contacting it or the wire bonds 106 between it and the substrate 102, and a mold compound 112 which encapsulates the die 104 on the substrate 102 to protect it and its electrical connections (e.g., the wire bonds 106) from breakage and hazardous environmental contaminants. The mold compound 112 is composed of a mixture of an epoxy resin and a ceramic filler material. The ceramic filler material has a higher thermal conductivity than the resin to facilitate heat transfer to the heat sink 110 and thereby enhance the thermal performance of the package 100. The top of the heat sink 110 is exposed at the top of the mold compound 112.

The mold compound resin may be any suitable compound, such as are presently in use for mold compounds. Suitable resins are well known in the art and include, for example, biphenyl (such as is available from Sumitomo, Japan (e.g., the LK product series) or from Nitto Denko, Japan (e.g., the MP-7xxx product series)), ortho cresol novolac (OCN) (such as is available from Nitto Denko, Japan) and dichlorophenol (DCP) (such as is available from Nitto Denko, Japan) epoxy resins, and others.

Any ceramic with greater thermal conductivity than the mold compound resin with which it is mixed and that does not have chemical or electrical properties that would otherwise detrimentally impact device performance may be used. $Al_2O_3$ and AlN are suitable mold compound fillers in accordance with the present invention.

As noted above, the higher thermal conductivity of the ceramic filler component of the mold compound facilitates heat transfer to the heat sink to dissipate heat from the package. As such, any amount of ceramic filler in the mold compound will enhance the thermal performance of the package. In general, the mold compound is composed of about 10 to 40% by weight of resin and about 60 to 90% by weight of ceramic filler. In a specific embodiment, about 80% by weight $Al_2O_3$ ceramic filler in a biphenyl epoxy resin is used.

Figure 2:
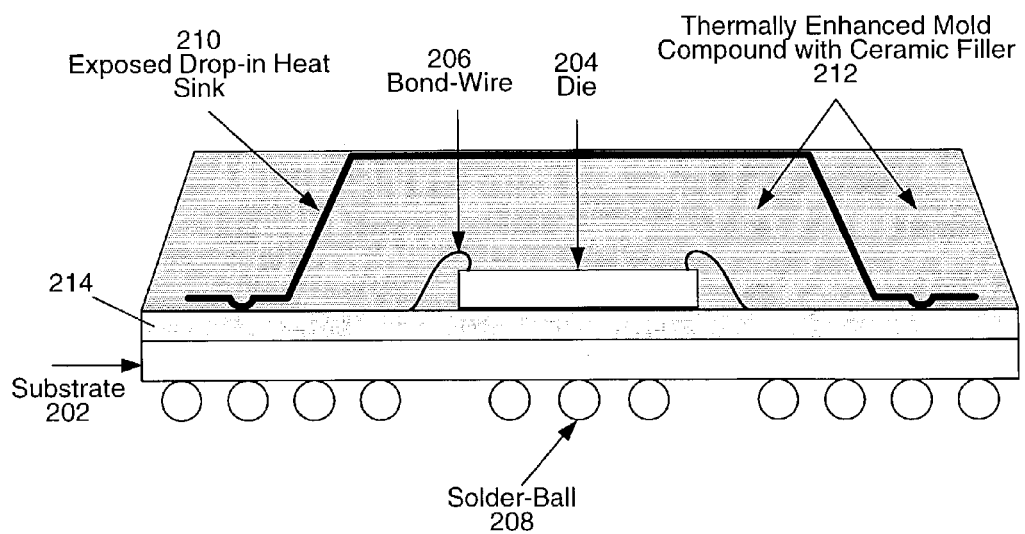
FIG. 2 depicts a cross-sectional view of a thermally enhanced BGA package with stiffener in accordance with a second embodiment of the present invention.

FIG. 2 shows a cross-sectional view of a thermally enhanced heat sink BGA package in accordance with a second embodiment of the present invention. This package 200 includes, in addition to the components described above in connection with FIG. 1, a stiffener 214. The package 200 includes a BGA substrate 202 and a semiconductor die 204 mounted on one surface of the substrate 202. The die 204 is electrically connected to the substrate 202 via bond wires 206 connecting pads on the die to pads on the die side of the substrate. An array of a solder balls 208 is provided on the board side pads.

The package 200 further includes a picture frame stiffener 214 bonded to the perimeter of the substrate 202, for example, by a thermo-set adhesive, to resist bending or warping of the substrate which sometime occurs due to mismatches in the coefficients of thermal expansion (CTEs) of the substrate and the die. The stiffener 214 may be composed of a high modulus (about $9\times10^6$ to $30\times10^6$ psi), high thermal conductivity (about 2 to 4 W/cm-K) metal about 10 to 40 mils thick, having substantially the same dimensions as the package substrate. One particularly suitable material is double sided black oxide copper.

In addition, the package 200 also includes a drop-in heat sink 210 which at least partially surrounds the die 204, without contacting it or the wire bonds 206 between it and the substrate 202, and a mold compound 212 which encapsulates the die 204 on the substrate 202 to protect it and its electrical connections (e.g., the wire bonds 206) from breakage and hazardous environmental contaminants. The mold compound 212 is composed of a mixture of an epoxy resin and ceramic filler material. The ceramic material has a higher thermal conductivity than the resin to facilitate heat transfer to the heat sink 210 and thereby enhance the thermal performance of the package 200. The top of the heat sink 210 is exposed at the top of the mold compound 212. The heat sink 210 may be connected with the substrate 202 via the stiffener 214.

Figure 3:
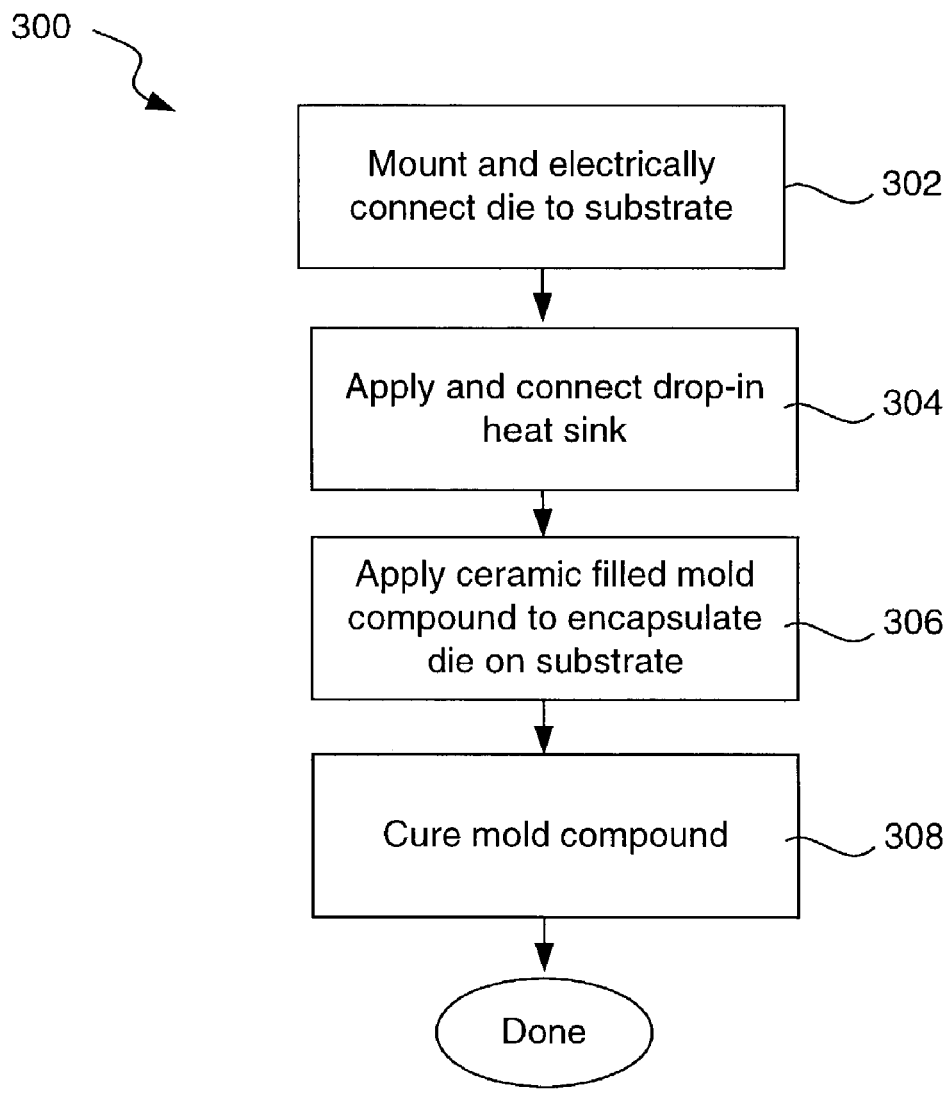
FIG. 3 depicts a flow chart showing stages of a method of assembling a thermally enhanced BGA package with stiffener in accordance with one embodiment of the present invention.

FIG. 3 is a flow chart showing stages in a process for assembling a heat sink BGA package in accordance with one embodiment of the present invention. An individual semiconductor die is mounted and electrically connected to a die side of a substrate (302). The other side of the substrate has an array of bonding pads bearing solder balls (a ball grid array (BGA)) by which electrical connection can be made to external circuitry, generally on a printed circuit board (PCB). The die is mounted on the substrate by a epoxy adhesive and electrical pads on the top of the die are then wire bonded to electrical pads on the die side of the substrate to complete the electrical connection of the die to the substrate.

A heat sink, generally composed of a conductive metal, such as copper, is positioned over the die and bond wires on the substrate and bonded, for example by soldering, to the substrate (304). This drop-in heat sink is configured to at least partially surround the die, without contacting it or the wire bonds between it and the substrate.

The package is then sealed by a mold compound, or encapsulant, in a molding operation. A polymeric mold composition containing a ceramic filler, such as is described above, is heated above its flow temperature, for example, about 175–180° C. and applied over the die on the substrate and molded to form a housing for the die (306). The mold compound cures upon cooling sealing the package with a highly thermally conductive material in contact with the die, substrate and heat sink. The sealed package protects the die from breakage, and hazardous environmental contaminants. The top of the heat sink is exposed at the top of the mold compound to facilitate heat dissipation. The sealed package is ready for bonding to a PCB (308).

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A semiconductor ball grid array package, comprising:
   a ball grid array packaging substrate;
   a semiconductor die mounted on and electrically connected with the substrate, the die having a top surface opposite a bottom surface, the bottom surface being used to mount the die to the substrate;
   a heat sink connected with the substrate and at least partially surrounding the die without contacting the die; and
   a mold compound encapsulating the die on the substrate and contacting the heat sink such that a first portion of the heat sink is exposed outside the mold compound and a second portion of the heat sink is within the mold compound, the mold compound being between the heat sink and the die, the mold compound comprising a mixture of an epoxy resin and ceramic filler material that increases thermal conductivity of the mold compound, and provides the principal thermal connection between the die and the heat sink.

2. The package of claim 1, wherein the ceramic material has a higher thermal conductivity than the resin.

3. The package of claim 1, wherein the resin is selected from the group consisting of biphenyl, OCN and DCP epoxy resins.

4. The package of claim 1, wherein the resin is a biphenyl epoxy resin.

5. The package of claim 1, wherein the ceramic filler material is selected from the group consisting of $Al_2O_3$ and AlN.

6. The package of claim 1, wherein the ceramic filler material is $Al_2O_3$.

7. The package of claim 1, wherein the mold compound is comprised of about 60 to 90% by weight of ceramic filler.

8. The package of claim 1, wherein the mold compound is comprised of about 80% by weight of ceramic filler.

9. The package of claim 8, wherein the mold compound is comprised of 80% by weight $Al_2O_3$ filler in a biphenyl epoxy resin.

10. The package of claim 1, wherein the heat sink is a drop-in heat sink.

11. The package of claim 1, further comprising a picture frame stiffener on the substrate.

12. The package of claim 11, wherein the heat sink is connected with the substrate via the stiffener.

13. The package of claim 1, wherein the heat sink comprises:
    a heat sink top member with a first and second surface, the first surface being the first portion of the heat sink exposed outside the mold compound, the second surface being opposite the first surface.

14. The package of claim 13, wherein the heat sink top member is substantially parallel to the top surface of the die.

15. The package of claim 14, wherein the mold compound connects the heat sink top member to the die.

16. The package of claim 15, wherein the mold compound directly connects the second surface of the heat sink top member to the top surface of the die.

17. The package of claim 14, wherein the mold compound substantially occupies a volume created between the second surface of the heat sink top member and the top surface of the die.

18. The package of claim 17, wherein the heat sink comprises:
    a plurality of heat sink side members corresponding to the second portion of the heat sink, wherein each side member is connected to the top member such that the top member and side members at least partially surround the die.

19. The package of claim 18, wherein at least one of the plurality of heat sink side members is connected to the top member at an angle not parallel to the top member.

20. The package of claim 18, wherein the mold compound substantially occupies a volume created between the top member, side members, and the die.

21. A method of assembling a semiconductor die with a packaging substrate, comprising:
    providing a ball grid array packaging substrate;
    mounting and electrically connecting the die with the substrate;
    connecting a heat sink with the substrate and at least partially surrounding the die without contacting the die;
    applying a mold compound over the die, the mold compound comprising a mixture of an epoxy resin and ceramic filler material that increases the thermal conductivity of the mold compound; and
    curing the mold compound to encapsulate the die on the substrate such that a first portion of the heat sink is exposed outside the mold compound and a second portion of the heat sink is within the mold compound, the mold compound being between the heat sink and the die, and the mold compound provides the principal thermal connection between the die and the heat sink.

22. The method of claim 21, wherein the ceramic material has a higher thermal conductivity than the resin.

23. The method of claim 21, wherein the resin is selected from the group consisting of biphenyl, OCN and DCP epoxy resins.

24. The method of claim 21, wherein the resin is a biphenyl epoxy resin.

25. The method of claim 21, wherein the ceramic filler material is selected from the group consisting of $Al_2O_3$ and AlN.

26. The method of claim 21, wherein the ceramic filler material is $Al_2O_3$.

27. The method of claim 21, wherein the mold compound is comprised of about 60 to 90% by weight of ceramic filler.

28. The method of claim 21, wherein the mold compound is comprised of about 80% by weight of ceramic filler.

29. The method of claim 28, wherein the mold compound is comprised of 80% by weight $Al_2O_3$ filler in a biphenyl epoxy resin.

* * * * *